United States Patent [19]

Okumura

[11] Patent Number: 4,807,021
[45] Date of Patent: Feb. 21, 1989

[54] SEMICONDUCTOR DEVICE HAVING STACKING STRUCTURE

[75] Inventor: Katsuya Okumura, Yokohama, Japan

[73] Assignee: Kabushiki Kaisha Toshiba, Kawasaki, Japan

[21] Appl. No.: 22,371

[22] Filed: Mar. 5, 1987

[30] Foreign Application Priority Data

Mar. 10, 1986 [JP] Japan .................................. 61-51870
Jun. 12, 1986 [JP] Japan ................................ 61-136840
Jun. 12, 1986 [JP] Japan ................................ 61-136841

[51] Int. Cl.$^4$ .................... H01L 23/16; H01L 23/48; H01L 29/46
[52] U.S. Cl. ...................................... 357/75; 357/68; 357/71
[58] Field of Search ............................. 357/75, 68, 71

[56] References Cited

U.S. PATENT DOCUMENTS 4,545,610 10/1985 Lakritz et al. ........................ 357/65

FOREIGN PATENT DOCUMENTS 58-43554 3/1983 Japan ..................................... 357/75
59-155951 9/1984 Japan ..................................... 357/75

OTHER PUBLICATIONS

Nikkei Electronics, 1985, 10.7 3-Dimensional LSI, "Now Emerging" As High Integration/Multi-Function Device.

Primary Examiner—Martin H. Edlow
Assistant Examiner—Robert P. Limanek
Attorney, Agent, or Firm—Finnegan, Henderson, Farabow, Garrett, & Dunner

[57] ABSTRACT

A semiconductor device includes a base semiconductor structure including semiconductor elements, interconnection layers for connecting the semiconductor elements together, and conductive pads to which the interconnection layers are connected, at least one stacking semiconductor structure including semiconductor elements, an interconnection layer for connecting the semiconductor elements together, and conductive pads to which the interconnection layers are connected, the stacking semiconductor structure having holes selectively formed therein to expose portions of the conductive pads, first conductive elements fixed in the holes of the stacking semiconductor structure, to be electrically connected to the exposed portions of the conductive pads, and second conductive elements fixed on the conductive pads of the base semiconductor structure, and fixed to the first conductive elements, with a gap provided between the base and stacking semiconductor structures.

14 Claims, 8 Drawing Sheets

F I G. 4A
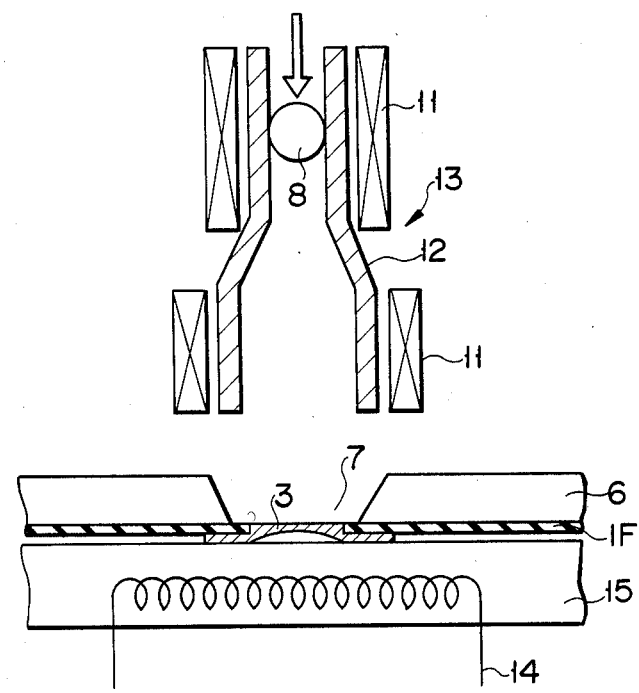
F I G. 4B
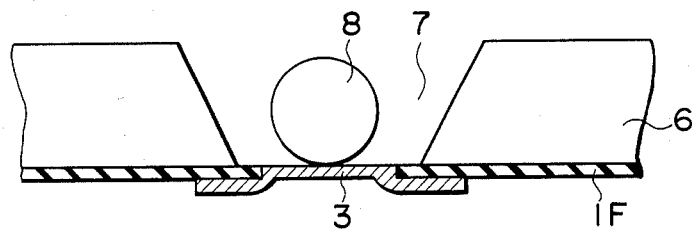

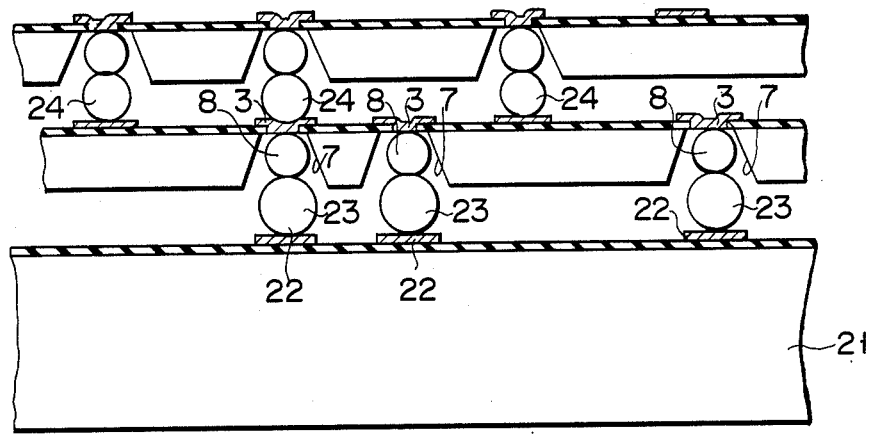
F I G. 6C
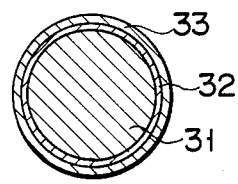
F I G. 7
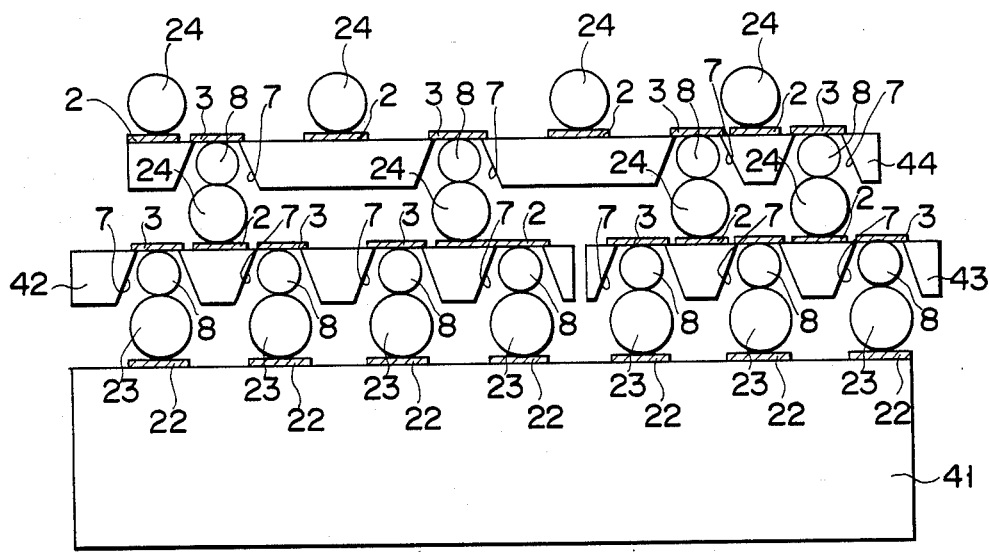
F I G. 8

F I G. 11
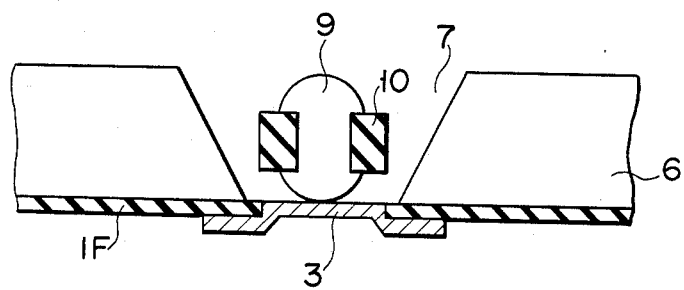
F I G. 12
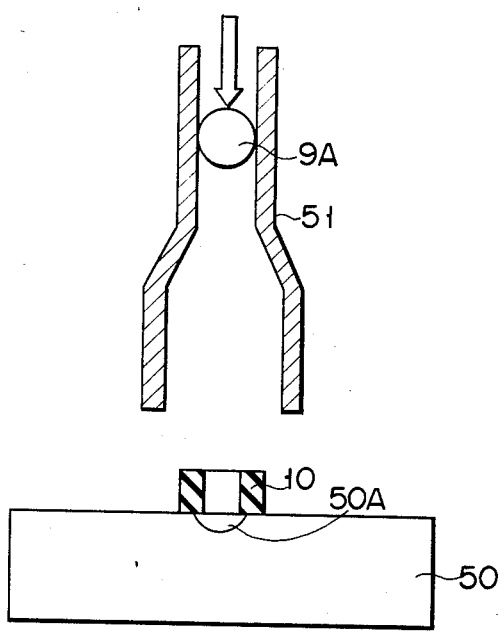

SEMICONDUCTOR DEVICE HAVING STACKING STRUCTURE

BACKGROUND OF THE INVENTION

The present invention relates to a semiconductor device constituted by stacking a plurality of semiconductor layers in which semiconductor elements are formed.

Recently, a three-dimensional SOI (Silicon On Insulation) device has been widely developed so as to realize a highly integrated multifunctional semiconductor device. In this technique, a monocrystalline silicon layer is formed on an amorphous insulating film of a semiconductor substrate surface, and semiconductor elements are formed using the monocrystalline layer, thereby to obtain a three-dimensional layer structure. Such a technique is described in, for example, an article "3-Dimensional LSI Emerging As High Integration/Multi-Function Device" of "NIKKEI ELECTRONICS", Oct. 7, 1985.

Nevertheless, development of the SOI technique has only just begun, and many drawbacks remain, with regard to its practical use. The main drawbacks are as follows:

① Since a plurality of semiconductor and insulation layers of different properties are stacked, and the stacked semiconductor layers are converted to monocrystalline layers by means of a high-temperature process, stress acting on the semiconductor layers becomes so great that cracks tend to occur in these layers, with the result that there may be a deterioration in the electrical properties thereof;

② Since the layers are formed in close contact with each other, the heat-dissipation efficiency is therefore low, i.e., heat tends to be retained inside.

Further, with the present semiconductor manufacturing technique, it is impossible to stack semiconductor materials other than silicon.

SUMMARY OF THE INVENTION

It is an object of the present invention to provide a semiconductor device having a stacked structure capable of preventing the occurrence of cracking caused by stress, stress and having good heat-dissipation efficiency.

The above object can be achieved by a semiconductor device comprising: a base semiconductor structure including semiconductor elements, interelement wiring layers for connecting the semiconductor elements together, and conductive pads to which the wiring layers are connected; at least one stacking semiconductor structure including semiconductor elements, interelement wiring layers for connecting the semiconductor elements together, and conductive pads to which the wiring layers are connected, holes being selectively formed in the stacking semiconductor structure, to expose portions of the conductive pads; first conductive stacking semiconductor structure, to be electrically connected to the exposed portions of the conductive pads; and second conductive elements fixed on the conductive pads of the base semiconductor structure, and fixed and electrically coupled to the first conductive element, with a gap being provided between the base and stacking semiconductor structures.

In the present invention, since a plurality of semiconductor structures are stacked and spaced apart from each other, no significant stress acts on the semiconductor layers, nor is heat retained inside the semiconductor device.

BRIEF DESCRIPTION OF THE DRAWINGS

FIGS. 4A to 4B are sectional views of a particle-fixing unit for fixing or bonding a conductive particle on a pad and the particle fixed on the pad in FIG. 3C;

FIGS. 6A to 6C are sectional views of semiconductor structures for explaining a method of stacking the stacking semiconductor structure shown in FIG. 3C on the base semiconductor structure shown in FIG. 5;

FIG. 7 is a sectional view of an example of a spherical particle usable as a conductive particle;

FIG. 8 is a sectional view of a semiconductor device obtained by stacking a plurality of stacking semiconductor structures having different substrates, on the same base semiconductor structure;

FIG. 11 is a sectional view of a particle whose side surface is covered with an insulating ring;

FIG. 12 is a sectional view of a particle-formation unit for forming a particle as shown in FIG. 11;

DETAILED DESCRIPTION OF THE PREFERRED EMBODIMENT

A method of manufacturing a semiconductor device having a stacking structure according to an embodiment of the present invention will now be described in detail.

Figure 1:
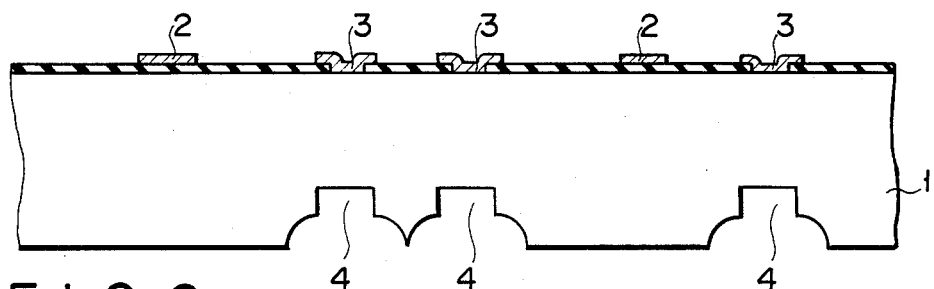
FIG. 1 is a sectional view of a semiconductor structure prepared to form a stacking semiconductor structure.

First, by use of a well-known two-dimensional LSI manufacturing method, semiconductor elements, interelement wirings (not shown) for bonding the semiconductor elements to each other, and 50 $\mu m \times 50$ $\mu m$ pads 2 and 3 of an Al film to which the wirings are connected, are formed on 450 $\mu m$-thick silicon wafer 1 shown in FIG. 1.

Figure 2:
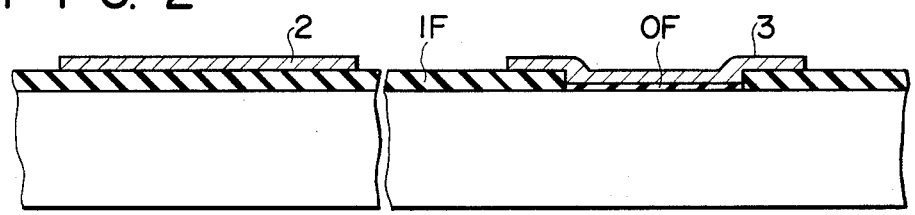
FIG. 2 is an enlarged sectional view of part of the semiconductor structure shown in FIG. 1.

As is shown in FIG. 2, in an enlarged scale, each pad 2 is formed on insulating interlayer IF, and each pad 3 is formed through an opening formed in interlayer IF (1 to 1.5 $\mu m$), so that a part thereof contacts thin oxide film OF (approx. 1000 Å) formed on a local portion of wafer 1 exposed at the opening. Film OF is formed to prevent pads 3 from electrically contacting wafer 1 during a die sort test. Note that instead of forming film OF, an impurity of a conductivity type opposite to that of wafer 1 may be doped in that portion of wafer 1 which is exposed at the opening for forming a p-n junction region, thereby preventing electrical connection occurring between pads 3 and wafer 1.

Then, recesses 4 each having an opening of 30 μm and a depth of 50 μm are formed in the rear surface of wafer 1, at positions corresponding to pads 3, by means of a combination of isotropic and anisotropic etching steps. Note that both the etching steps are performed by utilizing, for example, fluorine gas.

Figure 3A:
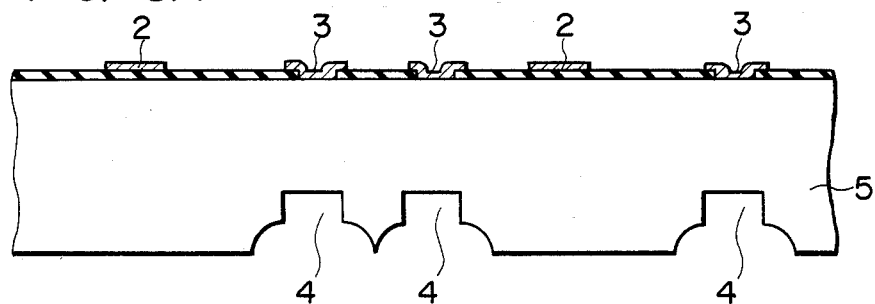
FIGS. 3A to 3C are sectional views of semiconductor structures for explaining a method of manufacturing a stacking semiconductor structure from the semiconductor structure shown in FIG. 1.
Figure 3B:
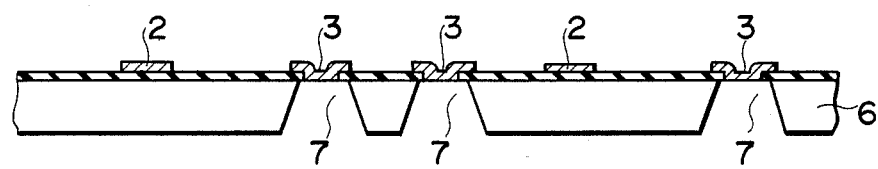

The die sort test is performed on wafer 1, the electrical characteristics of individual chips are checked, in order to select the good chips among them, and then wafer 1 is divided into a plurality of chips by way of dicing. An example of a good chip is shown in FIG. 3A. Then, as is shown in FIG. 3B, 45 μm-thick thin stacking semiconductor substrate 6 is formed on the entire rear surface of substrate 5 of the good chip, by means of anisotropic etching. In this anisotropic etching step, substrate 5 is etched so that recesses 4 substantially maintain their shapes, and oxide film OF (FIG. 2) is removed to expose the rear surfaces of pads 3. For this purpose, an etching agent whose etching selectivity or etching ratio with respect to Si and $SiO_2$ is 6 may be used. However, it is also possible to separately effect etching processes to Si and $SiO_2$. Finally, as is shown in FIG. 3B, substrate 6 having tapered holes 7 is obtained. The minimum diameter of holes 7 is, for example, 70 μm to 100 μm.

Figure 3C:
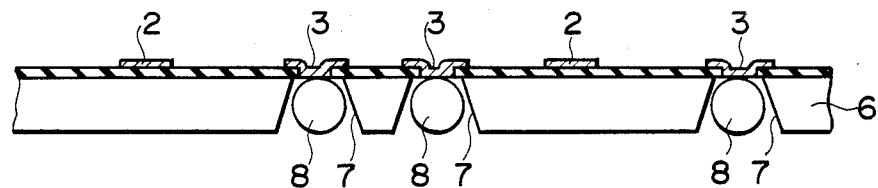

Thereafter, spherical particles 8 of such as Au are fixed on pads 3 in holes 7, to complete a stacking semiconductor structure, as shown in FIG. 3C.

In order to fix particles 8 onto pads 3, a device having particle-fixing unit 13 and support table 15 is used. As is shown in FIG. 4A, fixing unit 13 includes metal cylinder 12 having an inner diameter of about 30 μm, heater 11 mounted on cylinder 12, and support table 15 having heater 14 provided therein.

First, substrate 6 is placed on table 15, with pad 3 facing downward, and cylinder 12 is aligned with hole 7. Then, under the conditions wherein table 15 is maintained at a temperature of about 300° C. by heater 14 and cylinder 12 is maintained at a temperature of about 350° C. by heater 11, spherical particle 8 having a diameter of about 30 μm is inserted into cylinder 12. Using compressed nitrogen, heated particle 8 is accelerated and forced onto pad 3. When particle 8 strikes against pad 3, particle 8 and pad 3 are thermally bonded to each other as shown in FIG. 4B, due to both of them being heated to a high temperature. In this way, a stacking semiconductor structure having Au particles 8 fixed on pads 3 is obtained.

Figure 5:
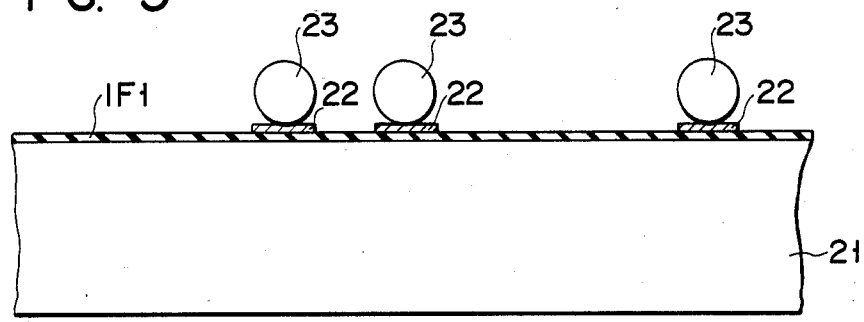
FIG. 5 is a sectional view of a base semiconductor structure.

On the other hand, in order to form a base semiconductor structure, semiconductor elements, interelement wirings (not shown), and 50 μm×50 μm pads of an Al film are formed on a 450 μm-thick silicon wafer, by means of the two-dimensional LSI method. Subsequently, after the die sort test, the good chips are selected, and the silicon wafer is then diced. An example of a thus-obtained good chip is shown in FIG. 5. Pads 22 are formed over substrate 21 of the good chip, through insulating layer IF1, and spherical particles 23 of Au each having a diameter of about 40 μm are fixed on pads 22, using unit 13 shown in FIG. 4A, whereby a base semiconductor structure is obtained.

Figure 6A:
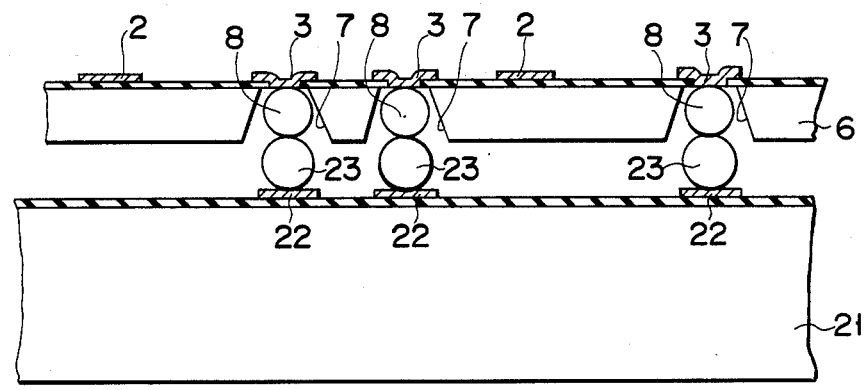

Then, the stacking semiconductor structure shown in FIG. 3C and the base semiconductor structure shown in FIG. 5 are stacked, with particles 8 and 23 facing each other. Thereafter, by pressing substrate 6 against substrate 21, by use of a hot plate at a temperature of about 300° C., particles 8 and 23 are fixed to each other, as is shown in FIG. 6A. Furthermore, as is shown in FIG. 6B, metal particles 24 of Au are fixed on selected ones of pads 2 and 3 on substrate 6, by use of unit 13.

Figure 6B:
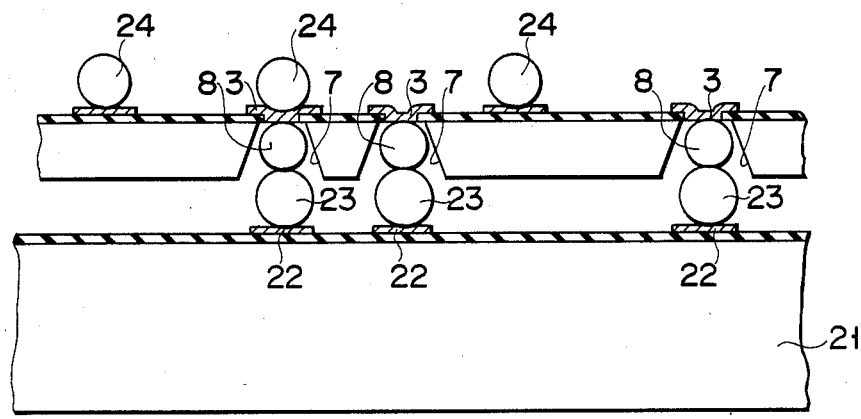

Then, a stacking semiconductor structure formed by steps similar to those shown in FIGS. 3A to 3C, is stacked on the semiconductor structure shown in FIG. 6B, to thereby obtain a semiconductor device of a multilayer structure shown in FIG. 6C.

As has been described above, in this embodiment, since the base semiconductor structure and the stacking semiconductor structure are electrically bonded together by means of pads 3 and 22 and particles 8, 23, and 24, a semiconductor device having a highly integrated multifunctional three-dimensional structure can be easily obtained.

Since substrates 6 and 21 are coupled by particles 8 and 23 formed of, for example, metal such as gold, which is soft in comparison with silicon and silicon oxide, any thermal stress is absorbed by these particles, and no cracking occurs in substrates 6 and 21. In addition, since substrates 6 and 21 are held spaced apart from each other, heat is not retained between them, thereby improving their heat-dissipation efficiency.

In addition, when spherical Au particle 16 is fixed on an exposed portion of pad 3 which corresponds to hole 7, Au particle 16 can be fixed without coming into contact with the inner surface of hole 7 of substrate 6. This is because hole 7 has a tapered shape, thereby preventing short-circuiting from occurring between particle 16 and hole 7.

Furthermore, according to the method of the above embodiment, recesses 4 are formed to have openings in the rear surface of the silicon wafer, by means of a combination of isotropic and anisotropic etching steps, after which the entire rear surface is anisotropically etched. Thus, thin stacking semiconductor substrate 6 having tapered holes 7 can be easily manufactured. In addition, by using the coupling particle-fixing unit shown in FIG. 4A, a coupling particle such as an Au particle can be pressed against and made to thermally adhere to pad 3 without damaging pad 3. As a result, a three-dimensional semiconductor device can be manufactured by very simple steps.

Note that in the above embodiment, a spherical Au particle is used as a coupling particle. However, a spherical particle of Al or Cu or a coupling particle obtained by covering the surface of a spherical stainless particle with an Au film may be used to reduce cost. More specifically, as is shown in FIG. 7, coupling particle 34 may be used. Particle 34 is obtained by forming nickel film 32 having a thickness of about 3 μm on the surface of, for example, spherical stainless steel particle 31 having a diameter of 30 μm, by plating thereon, and forming Au film 33 having a thickness of about 3 μm on film 32, again by plating it thereon. In this case, instead of a stainless steel particle, a particle formed of another metal, from glass, ceramic, heat-resistant plastic, or the like may be used. In addition, the coupling particle is not limited to a spherical shape but may have various shapes, for example, a solid cylinder. Note that it is preferable to use a spherical coupling particle with regard to relaxation of thermal stress or operability.

In the above embodiment, a description has been made with reference to a device in which a plurality of silicon stacking semiconductor structures are used and these structures are stacked on a chip.

However, when a plurality of stacking semiconductor structures are stacked on the chip, it becomes necessary to reduce the length of interconnection layers in the respective structures and between the structures as much as possible. In this case, if elements formed in the semiconductor structure are interconnected through interconnection layers formed in or on the semiconductor structure, the interconnection pattern may become complex, thereby increasing the time required for pattern design. In order to avoid this problem, it is possible to insert a multilayered interconnection substrate between the semiconductor structures, and to interconnect this substrate and each of the semiconductor structures.

In addition, as is shown in FIG. 8, chip 41 may be formed of silicon, silicon semiconductor substrate 42 and gallium arsenide substrate 43 may be stacked on chip 41, and silicon substrate 44 may be stacked on substrates 42 and 43, thereby obtaining a semiconductor device having a three-dimensional structure. Note that in FIG. 8, insulating interlayers (IF and IF1) formed on the surfaces of chip 41 and substrates 42 to 44 are omitted for simplicity. With the structure shown in FIG. 8, a semiconductor device having a three-dimensional structure which is more multifunctional than a conventional SOI structure can be easily obtained.

Another embodiment of the present invention will now be described, with reference to FIG. 9 and FIGS. 10A to 10C.

Figure 9:
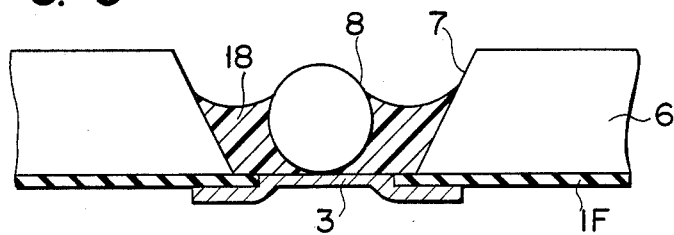
FIG. 9 is a sectional view of a particle reliably held by an insulating resin in a hole formed in the substrate.

After the semiconductor structure shown in FIG. 3C is obtained using the method of the above embodiment, an insulating organic resin solution of polyimide having a heat-resistance of 400° C. is injected into holes 7 of substrate 6, and is then heated for it to set, and insulating organic resin film 18 is formed so that the head of Au particle 8 in hole 7 is exposed as shown in FIG. 9. Note that in this step, if a resin film is adhered to the head of particle 8, an ashing treatment may be performed by use of oxygen plasma or the like, after the thermosetting process has been performed, to remove the resin film remaining on the head of particle 16. By means of this step, as is shown in FIG. 10A, substrate 6 is obtained in which particles 8 are adhered to exposed portions of pads 3 corresponding to holes 7, and resin film 18 is formed in holes 7, with the result that heads of particles 8 in holes 7 are exposed.

Figure 10A:
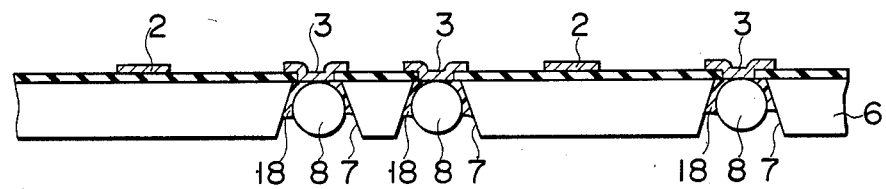
FIGS. 10A to 10C are sectional views of semiconductor structures for explaining a method of manufacturing a semiconductor device having a stacking structure, using the particle shown in FIG. 9.
Figure 10B:
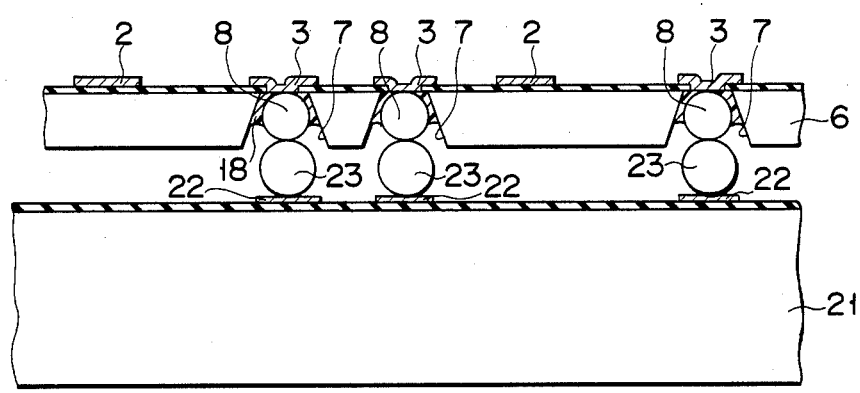
Figure 10C:
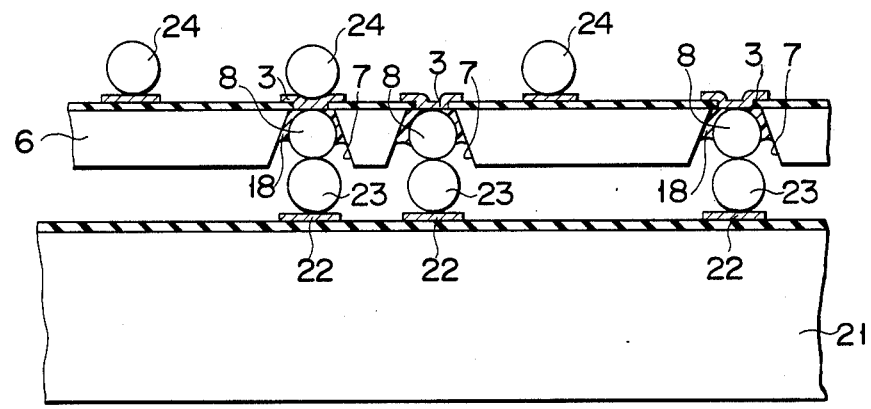

Then, the stacking semiconductor structure shown in FIG. 10A and the base semiconductor structure shown in FIG. 5 are stacked and processed in accordance with steps similar to those shown in FIGS. 6A and 6B, so as to obtain a semiconductor structure as shown in FIGS. 10B and 10C. In addition, similar to the structure shown in FIG. 6C, another stacking semiconductor structure may be stacked on the semiconductor structure shown in FIG. 10C.

In this embodiment, the same effect as that of the above embodiment can be obtained. In addition, since resin film 18, serving as an insulating material, is formed in hole 7 of substrate 6, whereby the head of particle 8 located at hole 7 (i.e. the portion which contacts the corresponding particle 23) is exposed, even if particle 8 in hole 7 is deformed when it is fixed on particle 23 of substrate 21, particle 16 can be prevented, by way of resin film 18, from coming into contact with the inner surface of hole 7 of substrate 6. As a result, short-circuiting between particle 8 and substrate 6 can be prevented.

Furthermore, in place of particle 8 using in the embodiment shown in FIGS. 6A to 6C, metal particle 9 covered partly with insulating ring 10 may be used, as is shown in FIG. 11.

Particle 9 with ring 10 is constituted by, for example, a unit including support table 50 having semispherical recess 50A and cylinder 51 having an inner diameter of 30 μm, as is shown in FIG. 12.

First, as is shown in FIG. 12, alumina ring 10 serving as an insulating material and having an inner diameter of 30 μm, an outer diameter of 40 μm, and a height of 15 μm is placed on the upper surface of table 50, and is which recess 50A is formed. Subsequently, Au particle 9A having a diameter of 30 μm is inserted in cylinder 51 above table 50, and is then accelerated by compressed nitrogen and forced into ring 10 placed on table 50, thereby manufacturing particle 9 whose side surface is covered with ring 10.

Then, particle 9 is inserted into a particle-fixing unit having substantially the same structure as that of the unit shown in FIG. 4A, except that a metal cylinder having an inner diameter of about 40 μm is used, and as is shown in FIG. 11, is fixed on pad 3 by way of the same step as that shown in FIG. 4A.

In the semiconductor structure thus obtained, since particle 9, whose side surface is covered with ring 10 as an insulating material, is fixed on pad 3 located at hole 7 formed in substrate 6, particle 9 is prevented, by ring 10, from coming into contact with the inner surface of hole 7 of substrate 6 when particle 9 is fixed in hole 7. As a result, short-circuiting between particle 9 and substrate 6 can be prevented. In addition, high alignment accuracy is not necessary when particle 9 is fixed on pad 3 in hole 7 of substrate 6, thereby improving productivity of the semiconductor device. Since short-circuiting can be prevented without the need to taper the hole, micropatterning of the hole and simplification of the manufacturing process can be achieved. Furthermore, if particle 9 in hole 7 is deformed when it is fixed onto particle 23 of substrate 21, it can be prevented by insulating ring 10, from coming into contact and being electrically coupled with the inner surface of hole 7 of substrate 6, and causing short-circuiting.

In place of the method shown in FIG. 12, a metal particle having an insulating ring similar to particle 9 with ring 10, shown in FIG. 11, may be formed in accordance with methods (1) to (4) to be described below.

Figure 13A:
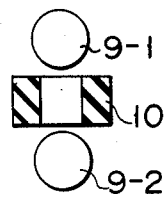
FIGS. 13A to 13B, FIGS. 14A and 14B, FIG. 15, and FIGS. 16A and 16B are views for illustrating a method of forming a particle similar to that shown in FIG. 11.
Figure 13B:
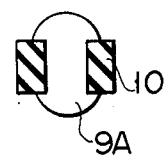

(1) As is shown in FIG. 13A, two small spherical Au particles 9-1 and 9-2 are forced at the upper and lower ends into alumina ring 10, for the manufacture of particle 9A whose side surface (FIG. 13B) is covered with ring 10. In this case, Al or Cu particles may be used instead of Au particles.

Figure 14A:
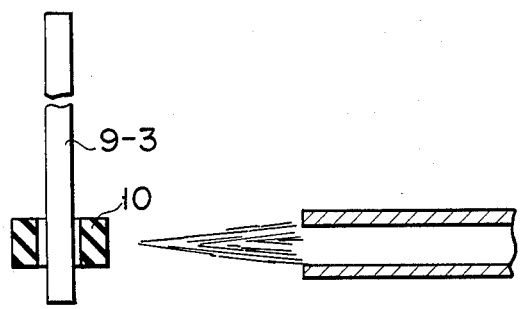
Figure 14B:

(2) Referring to FIG. 14A, Au wire 9-3 is inserted into ring 10, and is then melted by a hydrogen torch (or an arc), thereby to manufacture Au particle 9B, the side surface of which is covered with ring 10, as is shown in FIG. 14B. In this method, other metal wires such as an Al wire may be used instead of the Au wire.

Figure 15:
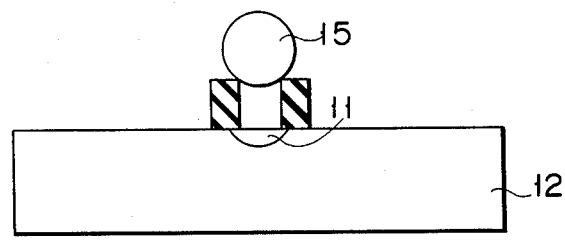

(3) As can be seen shown in FIG. 15, ring 10 is placed on support table 60 having semispherical recess 61, so that the hollow portion of ring 10 corresponds to recess 61. Au particle 9-4 is placed on ring 10, and is then melted so as to manufacture the Au particle whose side surface is covered with the alumina ring. In this method, if particle 9-4 is melted in a vacuum or in a nonoxidizing atmosphere, a metal particle which is easily oxidized, such as Al, Sn, solder, or Cu may be used to obtain a conductive coupling particle whose side surface is covered with a ring. In addition, when a coupling particle of such a metal is manufactured, an Au film or a solder film (if the metal is not solder) may be applied to improve the adhering properties with respect to the pad.

Figure 16A:
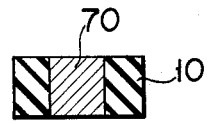

(4) A thick film conductive paste is charged into the hollow portion of ring 10, and is and then sintered at a predetermined temperature to form thick film conductor 70 in the hollow portion of ring 10, as is shown in FIG. 16A. Subsequently, electroless plating and electroplating of gold are carried out, to form gold-plated portions 71 and 72, thereby manufacturing the conductive coupling particle whose side surface is covered with ring 10. As the thick film conductive paste, a versatile paste of a conductive powder such as Ag-Pt, Au-Pd, Mo, and W and a binder may be used. In addition, by using a solder dip such as Sn-Pb instead of electroless plating and electroplating, a solder film may be formed on the exposed surface of the thick film conductor charged integrally into the hollow portion of the alumina ring.

In the above embodiment, alumina is used to form insulating ring 10, but ceramics such as mullite or silicon nitride, glass, or heat-resistant synthetic resin such as polyimide may also be used.

In the above embodiment, a description has been made with reference to the case in which a conductive coupling particle, whose side surface is covered with an insulating material, is fixed on a pad. However, a particle having its side surface covered with an insulating material such as an alumina ring may be used at portions other than the coupling hole (e.g., Au particles 23 and 24 in the embodiment). In this case, since short-circuiting between coupling particles can be prevented by the insulating materials at their sides, the intervals between the particles can be reduced, to improve packing density and reliability.

The semiconductor device having the stacking structure according to the present invention has been described with reference to the above embodiments; the present invention is, however, not limited to these embodiments.

For example, polyimide resin is used to form insulating organic resin film 18 in the embodiment shown in FIGS. 10A to 10C, but silicon resin or epoxy resin may also be used.

Figure 16B:
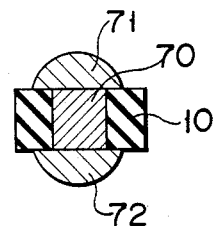

In addition, gold-plated portion 71 may be removed from the conductive coupling particle shown in FIG. 16B. In this case, gold-plated portion 72 is fixed on pad 3.

Figure 17:
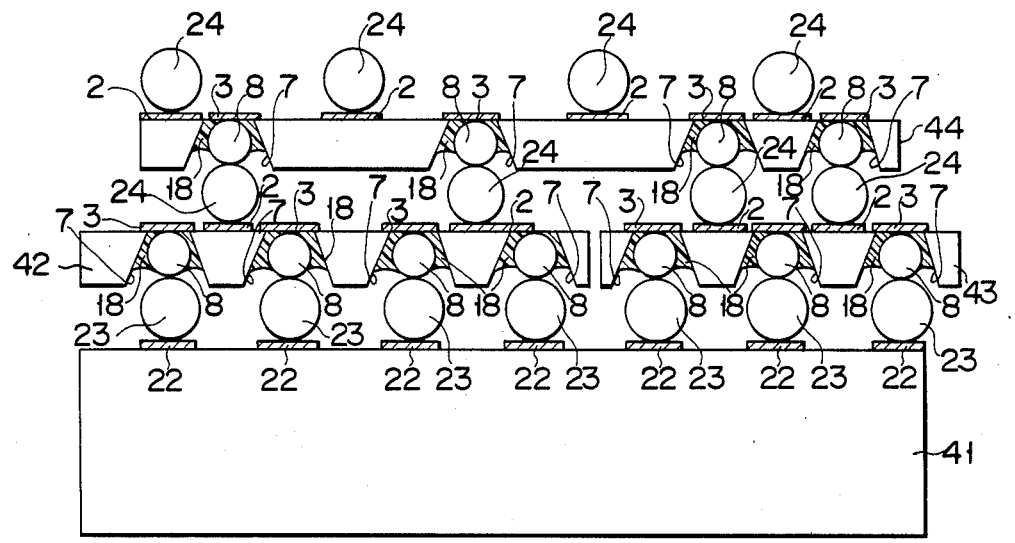
FIGS. 17 and 18 are sectional views of modifications of the semiconductor device FIG. 8.
Figure 18:
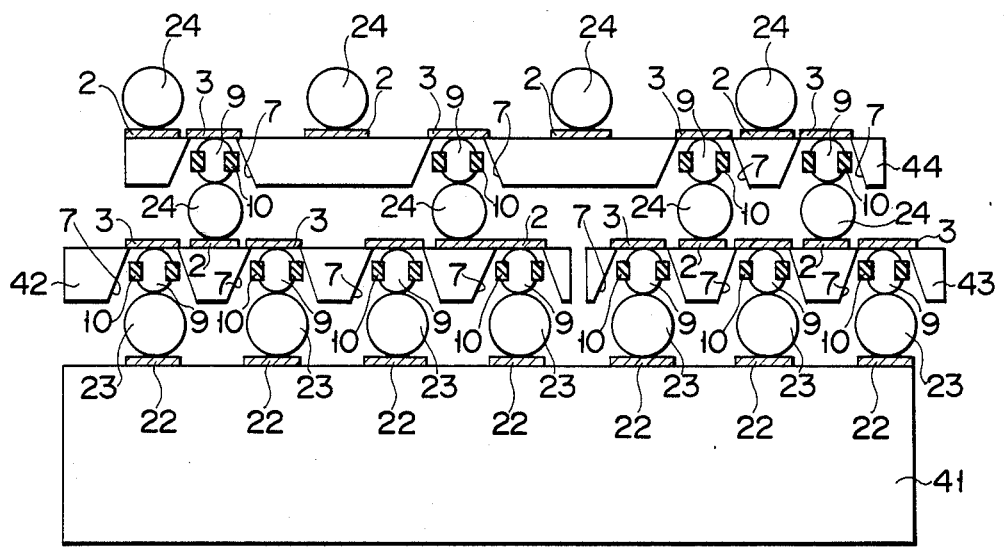

Furthermore, the semiconductor device shown in FIG. 8 may be changed, as is shown in FIGS. 17 and 18, respectively, using insulating organic resin film 18 shown in FIG. 9 or metal particle 9 with insulating ring 10, shown in FIG. 11. Note that in FIGS. 17 and 18, in a manner similar to FIG. 8, an insulating interlayer formed on the surfaces of chip 41 and substrates 42 to 44 is omitted for simplification.

I claim:

1. A semiconductor device comprising:
   a base semiconductor structure having a flat main surface and including semiconductor elements, interelement wiring layers formed on said flat main surface for connecting said semiconductor elements together, and conductive pads provided on said main surface and connected to the interelement wiring layers;
   at least one stacking semiconductor structure stacked on said base semiconductor structure, the stacking semiconductor structure having a flat main surface and a rear surface and including semiconductor elements, interelement wiring layers formed on said flat main surface for connecting said semiconductor elements together, conductive pads provided on said main surface for connection to the interelement wiring layer, and holes selectively formed at said rear surface of said stacking semiconductor structure to expose portions of rear surfaces of said conductive pads;
   first conductive elements fixed in said holes of said stacking semiconductor structure for direct connection to the exposed rear surface portions of said conductive pads; and
   second conductive elements fixed on said conductive pads of said base semiconductor structure and fixed on said first conductive elements to produce a gap between said base and said at least one stacking semiconductor structure.

2. A device according to claim 1 further comprising:
   at least one additional stacking semiconductor structure including semiconductor elements, interelement wiring layers for connecting said semiconductor elements together, and conductive pads to which said wiring layers are connected, holes being selectively formed in said additional stacking semiconductor structure, to expose portions of said conductive pads;
   third conductive elements fixed in holes of said additional stacking semiconductor structure, to be electrically connected to the exposed portions of said conductive pads; and
   fourth conductive elements selectively fixed on said conductive pads of said additional stacking semiconductor structure, and fixed and electrically coupled to said third conductive elements, with a gap provided between said stacking semiconductor structure and said additional semiconductor structure.

3. A device according to claim 2, wherein said first and third conductive elements are spherical particles respectively having diameters substantially the same as thicknesses of said stacking semiconductor structure and said additional semiconductor structure.

4. A device according to claim 3, wherein said spherical particle is formed of one of Al, Cu, and Au.

5. A device according to claim 3, wherein said spherical particle is formed of a spherical body and a conductive layer formed thereon.

6. A device according to claim 2, wherein each of said first and third conductive elements has a conductive member, with an insulating member formed on the side surface of said conductive member.

7. A device according to claim 6, wherein said conductive member is formed of one of Al, Cu, and Au.

8. A device according to claim 2, further comprising an insulating member formed to hold said first and third conductive elements in holes of said stacking semiconductor structure and said additional semiconductor structure.

9. A device according to claim 1, further comprising an insulating member formed to hold said first conductive elements in holes of said stacking semiconductor structure.

10. A device according to claim 1, wherein said first conductive elements are spherical particles each having a diameter substantially the same as a thickness of said stacking semiconductor structure.

11. A device according to claim 10, wherein said spherical particle is formed of one of Al, Cu and Au.

12. A device according to claim 10, wherein said spherical particle is formed of a spherical body and a conductive layer formed thereon.

13. A device according to claim 1, wherein each of said first conductive elements has a conductive member, with an insulating member formed on the side surface, of said conductive member.

14. A device according to claim 13, wherein said conductive member is formed of one of Al, Cu and Au.

* * * * *